(12) United States Patent  
Rhee

(10) Patent No.: US 6,201,563 B1  
(45) Date of Patent: Mar. 13, 2001

(54) TRELLIS CODE MODULATION DECODER STRUCTURE FOR ADVANCED DIGITAL TELEVISION RECEIVER

(75) Inventor: Dojun Rhee, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/093,362

(22) Filed: Jun. 8, 1998

(51) Int. Cl.[7] .................................. H04N 7/64; H04N 5/21
(52) U.S. Cl. ........................ 348/21; 348/607; 348/608; 348/725; 348/470; 348/426; 375/341; 375/296; 375/346
(58) Field of Search ................. 348/21, 17, 607, 348/608, 609, 725, 614, 470, 426, 723; 375/341, 262, 263, 265, 295, 296, 346; H04N 5/21, 7/64

(56) References Cited

U.S. PATENT DOCUMENTS

| | | | |
|---|---|---|---|
| 5,258,987 | * | 11/1993 | Wei ........................................ 371/43 |
| 5,311,547 | * | 5/1994 | Wei ........................................ 375/101 |
| 5,398,073 | * | 3/1995 | Wei ........................................ 348/487 |
| 5,428,646 | * | 6/1995 | Eyuboglu ............................ 375/354 |
| 5,452,015 | * | 9/1995 | Hulyalkar ............................ 348/608 |
| 5,453,797 | * | 9/1995 | Nicolas et al. ..................... 348/607 |
| 5,511,096 | * | 4/1996 | Huang et al. ....................... 375/265 |
| 5,512,957 | * | 4/1996 | Hulyalkar ............................ 348/607 |
| 5,572,249 | * | 11/1996 | Ghosh ................................... 348/21 |
| 5,583,889 | * | 12/1996 | Citta et al. ........................... 375/341 |
| 5,600,677 | * | 2/1997 | Citta et al. ........................... 375/296 |
| 5,602,602 | * | 2/1997 | Hulyalkar ............................ 348/607 |
| 5,629,958 | * | 5/1997 | Willming ............................. 375/295 |
| 5,636,251 | * | 6/1997 | Citta et al. ........................... 375/341 |
| 5,648,822 | * | 7/1997 | Hulyalkar ............................ 348/607 |
| 5,745,187 | * | 4/1998 | Hulyalkar et al. .................. 348/607 |
| 5,781,569 | * | 7/1998 | Fossorier et al. ................... 371/43.7 |
| 5,841,478 | * | 11/1998 | Hu et al. .............................. 348/607 |
| 5,841,484 | * | 11/1998 | Hulyalkar et al. .................. 348/607 |
| 5,844,947 | * | 12/1998 | Cesari .................................. 375/341 |
| 5,862,156 | * | 1/1999 | Huszar et al. ....................... 375/341 |
| 5,862,192 | * | 1/1999 | Huszar et al. ....................... 375/341 |

* cited by examiner

Primary Examiner—John K. Peng  
Assistant Examiner—Jean W. Désir  
(74) Attorney, Agent, or Firm—Conley, Rose & Tayon Law Firm

(57) ABSTRACT

An ATV receiver is provided with a 16-state trellis decoder to achieve improved performance in the presence of NTSC co-channel interference. In one embodiment, the ATV receiver comprises a tuner, a comb filter, and a trellis decoder. The tuner is configured to downmix a selected channel frequency signal to an intermediate frequency signal, where the comb filter is configurable to screen out most of the NTSC co-channel interference. The intermediate frequency receive signal is modified by the comb filter to resemble a partial response signal. The trellis decoder the demodulates the partial response signal in an improved fashion taking into account the state of the trellis encoder and the partial response channel. The trellis decoder may have a 16 state trellis comprised of four 4-state butterflies wherein each edge in the trellis is a single transition.

14 Claims, 9 Drawing Sheets

TRELLIS CODE MODULATION DECODER STRUCTURE FOR ADVANCED DIGITAL TELEVISION RECEIVER

BACKGROUND OF THE INVENTION

1. Field of the Invention

This invention relates to an apparatus for receiving and decoding a digital video broadcast signal. More specifically, this invention relates to a device with a new trellis code modulation decoder structure which demonstrates an improved performance in the presence of NTSC co-channel interference.

2. Description of the Related Art

A Digital Television System (DTS) standard was recently prepared by the Advanced Television Systems Committee (ATSC). The DTS standard outlines various system characteristics of the Advanced Television (ATV) system proposed for use in the U.S., and Annex D in particular specifies the Radio Frequency (RF) transmission subsystem for the DTS standard. The RF transmission subsystem performs amplitude and vestigial sideband modulation (VSB) in two modes: a terrestrial mode (8-level VSB, or simply 8 VSB)) and a high data rate mode (16-level VSB, or simply 16 VSB). Since no trellis code modulation is employed in the 16 VSB mode, the discussion hereafter will focus on the 8 VSB mode.

Turning now to the figures, FIG. 1 shows one embodiment of a ATV transmitter 100. The ATV transmitter comprises a data randomizer 102, a Reed-Solomon encoder 104, an interleaver 106, a trellis encoder 108, a sync word insertion module 110, a pilot insertion module 112, a VSB modulator 114, and a radio-frequency (RF) up-converter 116. The ATV transmitter 100 receives a digital audiovisual signal, e.g. an MPEG bitstream, in the form of 188-byte data packets. The first byte is a synchronization byte, and the remaining 187 bytes are payload data.

Data randomizer 102 drops the synchronization byte and changes each remaining byte value according to a known pattern of pseudo-random number generation in order to eliminate repetitious patterns and provide the data with a completely random noise-like character. Reed-Solomon encoder 104 encodes the 187 randomized bytes to add 20 redundancy bytes to enable future error correction of up to 10 byte errors. Interleaver 106 re-orders the encoded bytes to intermix the byes from different packets and thereby provide resistance to burst errors (since all the bytes for a given packet are no longer located in a short time interval). Trellis encoder 108 provides further encoding and modulation, and is discussed further below. At the trellis encoder output, 328symbols are produced for every 187 input bytes. Sync word insertion module 110 pre-pends a 4-symbol segment synchronization word to each group of 328 symbols to form a 332 symbol data segment, and further inserts a field synchronization segment for every set of 312 data segments to form a 313 segment data field. Pilot insertion module 112 provides a DC offset to all the symbols. The DC offset will appear as a carrier tone in the modulated signal. VSB modulator 114 modulates the symbols from module 112 onto an intermediate frequency (IF) carrier in 8-level amplitude-modulated vestigial-sideband form, and RF up-converter 116 moves the IF signal into the assigned frequency channel, and amplifies and filters the output signal before supplying it to a transmit antenna.

The trellis encoder 108 actually consists of 12 identical trellis encoders 202–224 as shown in FIG. 2. The bytes coming into the trellis encoder 108 are divided into two-bit symbols, and each trellis encoder 202–224 receives every 12th two-bit symbol, i.e. encoder 202 operates on the 0th, 12th, 24th, 36th, . . . two-bit symbols, encoder 204 operates on the 1st, 13th, 25th, 37th, . . . two-bit symbols, and so on. At the output of the encoders 202–224, a three-bit symbol is provided for each two-bit input symbol. During insertion of the segment synchronization byte, the output multiplexer of FIG. 2 is advanced by four symbols, although the state of the encoders is not advanced.

FIG. 3 shows one embodiment of trellis encoder 202. The most-significant bit (MSB) of the two-bit word is "pre-coded" using delay element 302 and XOR gate 304 to produce mapper input $Z_2$. The least-significant bit (LSB) is convolutionally encoded using delay elements 306, 308 and XOR gate 310 to produce mapper inputs $Z_1$, $Z_0$. The three mapper inputs may be converted to a signal amplitude immediately by a mapper 312, but typically $Z_2$, $Z_1$, and $Z_0$ are simply forwarded as a three bit symbol and converted later by VSB modulator 114.

FIG. 4 shows a second embodiment of trellis encoder 202. In this embodiment, the convolutional encoder formed by delay elements 406, 408 and XOR gate 410, is a moving-window encoder rather than a feedback encoder. The correspondence between input bits and output sequences is somewhat altered, but the overall code properties are the same. Either encoder may be employed.

During the transition period from the National Television Standards Committee (NTSC) standard to the DTS standard, many ATV transmissions will take place in channels which are shared by NTSC transmissions in neighboring broadcast regions. It is desirable to provide a system with increased immunity to co-channel interference from these NTSC transmissions.

FIG. 5 shows one embodiment of an ATV receiver 500 which includes provisions for screening out interfering NTSC transmissions. Receiver 500 comprises tuner 502, IF module 504, NTSC rejection filter 506, equalizer 508, phase tracker 510, trellis decoder 512, de-interleaver 514, Reed-Solomon decoder 516, and de-randomizer 518.

Tuner 502 receives all the signals in a designated frequency band from the receiver antenna, and downmixes a selected channel to IF (at 44 MHz). IF module 504 filters out undesired adjacent channels using a square-root raised-cosine bandpass filter, and locks on to the carrier tone using a narrowband frequency-and-phase locked loop (FPLL). NTSC rejection filter 506 is a "comb" filter with nulls near the standard NTSC luminance, color, and audio carrier frequencies to screen out interference from NTSC transmissions. Filter 506 may be switched in or out of the processing pipeline as needed.

Equalizer 508 is a moving-window adaptive equalizer that operates to remove any linear distortions (e.g. spectrum tilt, multi-path echo) from the received signal and thereby maximize the "eye openings" in the equalized signal. Phase tracker 510 is a wide-band first-order tracking loop that removes any remaining phase noise not tracked by the FPLL carrier recovery loop. The phase tracker 510 operates independently of the preceding modules.

Trellis decoder 512 operates according to the Viterbi algorithm to demodulate the data, in a manner discussed further below. De-interleaver 514 reverses the operation of interleaver 106 to gather the dispersed bytes from Reed-Solomon encoded packets back together, and Reed-Solomon decoder 516 decodes the packets, providing error correction as needed. The de-randomizer then reverses the operation of randomizer 102 to produce the original data packets.

FIG. 6 shows that trellis decoder 512 is actually comprised of 12 identical trellis decoders 602–624. The trellis decoders each process every 12th signal sample and form a two-bit symbol decision for each signal sample. To drop the synchronization bytes, the input multiplexer continues to advance during synchronization intervals, but the processing by the trellis decoders 602–624 is frozen. The two-bit symbol decisions are re-assembled into bytes by the output multiplexer before being forwarded to the de-interleaver 514.

FIG. 7 illustrates the modes of operation of the trellis decoder 602. Trellis decoder 602 implements a 4-state trellis decoder 702 when the NTSC rejection filter is not used. When the NTSC rejection filter is used, an 8-state trellis decoder 704 is implemented. The effect of the comb filter is indicated by the presence of the delay element 706 and sum element 708, which adds additional state dependence to valid received signal sequences. The delay element 706 and summer 708 are shown for explanatory purposes only and are not actually part of the trellis decoder 602. The point made here is that the 8-state trellis decoder must take into account the effect of the comb filter to operate properly. Although the comb filter reduces the NTSC interference, it also modifies the receive signal symbols. The eight-level symbols are converted to fifteen-level symbols by the "partial response" characteristic of the comb filter. This characteristic advantageously does not reduce the eye openings in the equalized data, but does amplify the white noise present in the receive signal. Consequently, a white-noise performance penalty is paid in return for removing the coherent NTSC interference, and to avoid unnecessary impairment, the comb filter is configured to be bypassed when no NTSC interference is present.

FIG. 8 illustrates an embodiment of the 4-state trellis employed by trellis decoder 702. The Viterbi algorithm tracks all the most likely received signal sequence evolutions through multiple trellis stages, and each stage is identical to that shown in FIG. 8. In one embodiment, the trellis decoder employs a Viterbi algorithm with a decoding depth of 18 stages. Each trellis stage consists of all possible code states at a given time t (802) and the transitions 804 to the possible code states at a subsequent time t+1 (806). Each of the possible code states 802 is assigned a value indicative of the probability of the most likely sequence that ends in that state. For each of the transitions 804, the receive signal is compared with an expected signal value to determine a likelihood that that transition was taken from the originating state, and this likelihood is combined with the value from the originating state to determine a potential value for the destination state. The destination state is then assigned a selected potential value from all incoming transitions which is indicative of the highest likelihood. By performing this iterative process and tracking the selected transitions, the Viterbi algorithm provides maximum-likelihood demodulation and decoding of the received signal.

The trellis code states 802, 806 are determined using the binary contents of the delay elements 306 ($S_0$) and 308 ($S_1$). The precoding delay element 302 does not provide for additional coding gain, and its inclusion here would require additional states, so it is ignored for the moment—the inverse precoding may be performed after the decisions made by the trellis decoder. The inputs to the trellis encoder are then $I_1$ and $Z_2$, and the corresponding expected receive signal value R is a function of the trellis state 802. For each state 802, ordered triplets ($I_1, Z_2, R$) are provided indicative of the expected values R for each pair of inputs $I_1$ and $Z_2$. Each ordered triplet corresponds to a transition from the state 802, and the ordering from left to right is selected to correspond with transitions in top-to-bottom order. It is noted that the four transitions leaving each state 802 exist in parallel pairs.

The embodiment of the decoder trellis in FIG. 8 corresponds to the feedback trellis encoder of FIG. 3. An embodiment of the decoder trellis for the moving window trellis encoder of FIG. 4 is shown in FIG. 9. Here the code states 902, 906 are determined by the binary contents of delay elements 406 ($S_0$) and 408 ($S_1$). As indicated by the triplets 908, the correspondence between expected results R and the transitions 904 is the same as that of FIG. 8, but the correspondence with the inputs $I_1$ and $Z_2$ is slightly different, and hence the decoded bits for selected transitions which are part of the most likely code sequence are different.

FIG. 10 illustrates an embodiment of the 8-state decoder trellis for trellis decoder 704. Trellis decoder 704 may have a decoding depth of 36 stages. The trellis states 1002, 1006 are determined by the binary contents of delay elements 306 ($S_0$) and 308 ($S_1$) and the eight-level contents of delay element 706 (D). Although this would allow for as many as 32 trellis states, the contents of D are not entirely independent of the contents of $S_0$ and $S_1$, which eliminates many of the possible states. Further, the remaining states may be combined in pairs to reduce the number of states without reducing the minimum distance properties of the trellis code. The increased number of states (relative to the 4-state trellis) does allow for the precoding of $I_2$ to be accounted for in this trellis, so the triplets 1008 are now provided in ($I_1, I_2, R'$) form, where R' is the expected value of the receive signal after the comb filter is taken into account.

The brackets in each state label indicate the combined values of delay element 706. The resulting trellis has six transitions 1004 leaving each state 1002 in parallel groups of three. Two transitions from each group share common information bits but have different expected signal values—the bracketed pairs in the ordered triplets 1008 indicate this sharing, but to determine the correspondence between triplets and transitions, these should be read as distinct, adjacent triplets.

The trellis in FIG. 10 is used when the transmitter uses the trellis code modulator of FIG. 3. When the transmitter uses the modulator of FIG. 4, the decoder 704 uses a trellis with the same structure but with a slightly different input bit correspondence, so that the decoded input bits for many of the transitions are different.

It is noted that the Viterbi algorithm assumes that the noise in the receive signal is uncorrelated, and it is further noted that this assumption is violated when the comb filter is employed. As a consequence, the performance (in terms of probability of decision error) of decoder 704 falls short of optimal. It is desirable to provide an ATV receiver which has improved performance in the presence of NTSC co-channel interference.

SUMMARY OF THE INVENTION

Accordingly, there is provided herein an ATV receiver which employs a 16-state trellis decoder to achieve improved performance in the presence of NTSC co-channel interference. In one embodiment, the ATV receiver comprises a tuner, a comb filter, and a trellis decoder. The tuner is configured to downmix a selected channel frequency signal to an intermediate frequency signal, where the comb filter is configurable to screen out most of the NTSC co-channel interference. The intermediate frequency receive signal is modified by the comb filter to resemble a partial response signal. The trellis decoder then demodulates the partial response signal in an improved fashion taking into account the state of the trellis encoder and the partial response channel. The trellis decoder may have a 16 state trellis comprised of four 4-state butterflies (fully connected bipartite graphs) wherein each edge in the trellis is a single transition (i.e. there are no parallel transitions between states).

BRIEF DESCRIPTION OF THE DRAWINGS

Other objects and advantages of the invention will become apparent upon reading the following detailed description and upon reference to the accompanying drawings in which.

Figure 1:
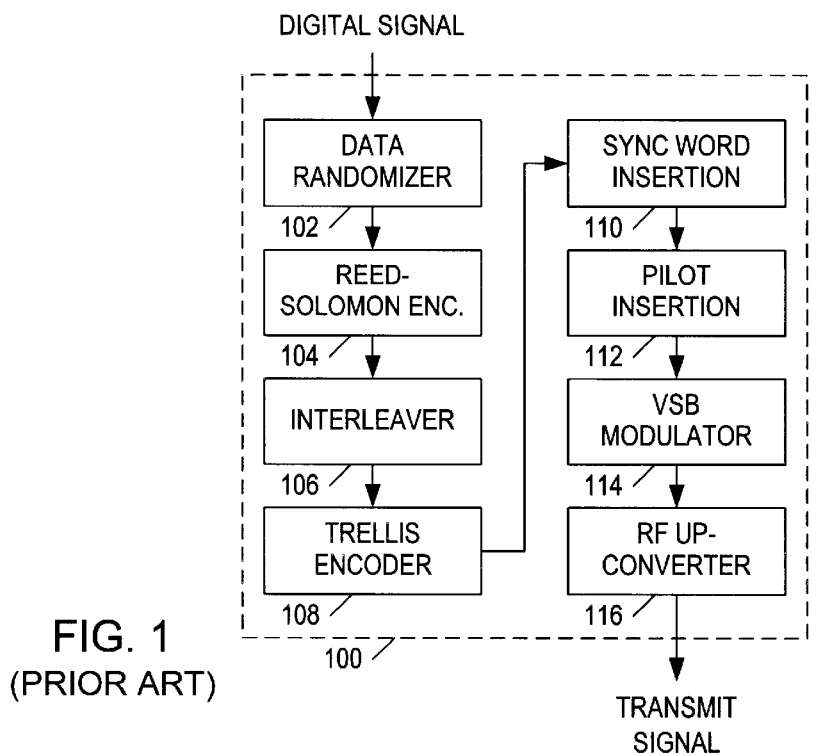
FIG. 1 is a functional block diagram of an ATV transmitter.
Figure 2:
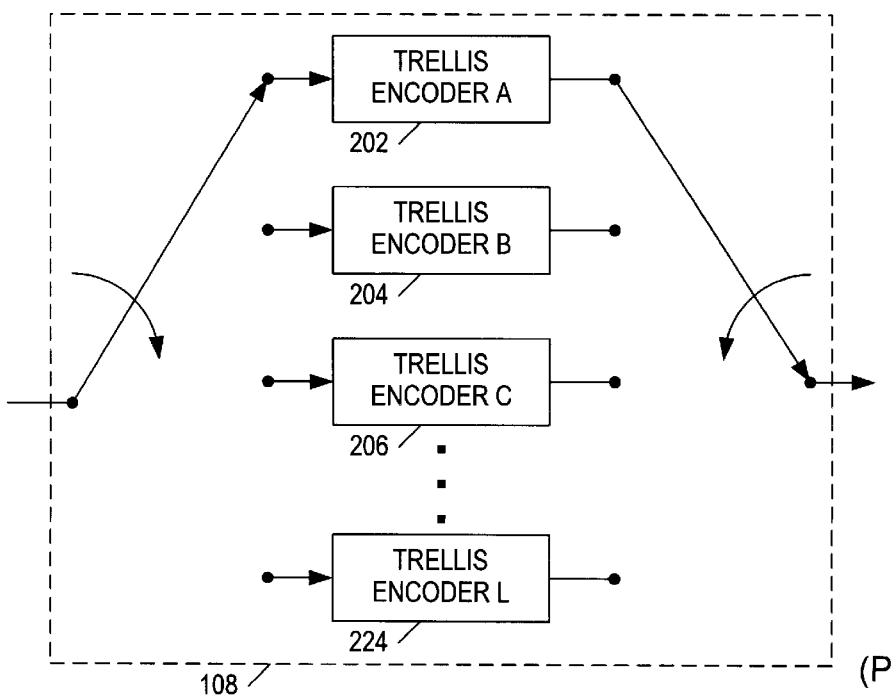
FIG. 2 is a functional block diagram of an interleaved trellis encoder.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Figure 3:
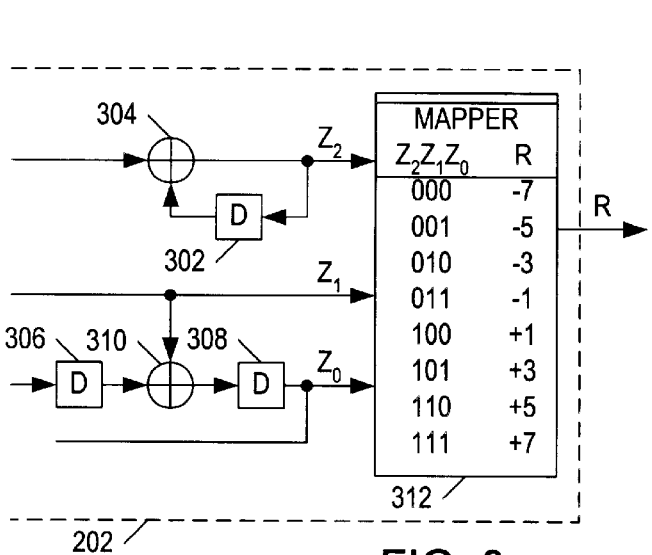
FIG. 3 is a block diagram of a feedback trellis encoder.
Figure 11:
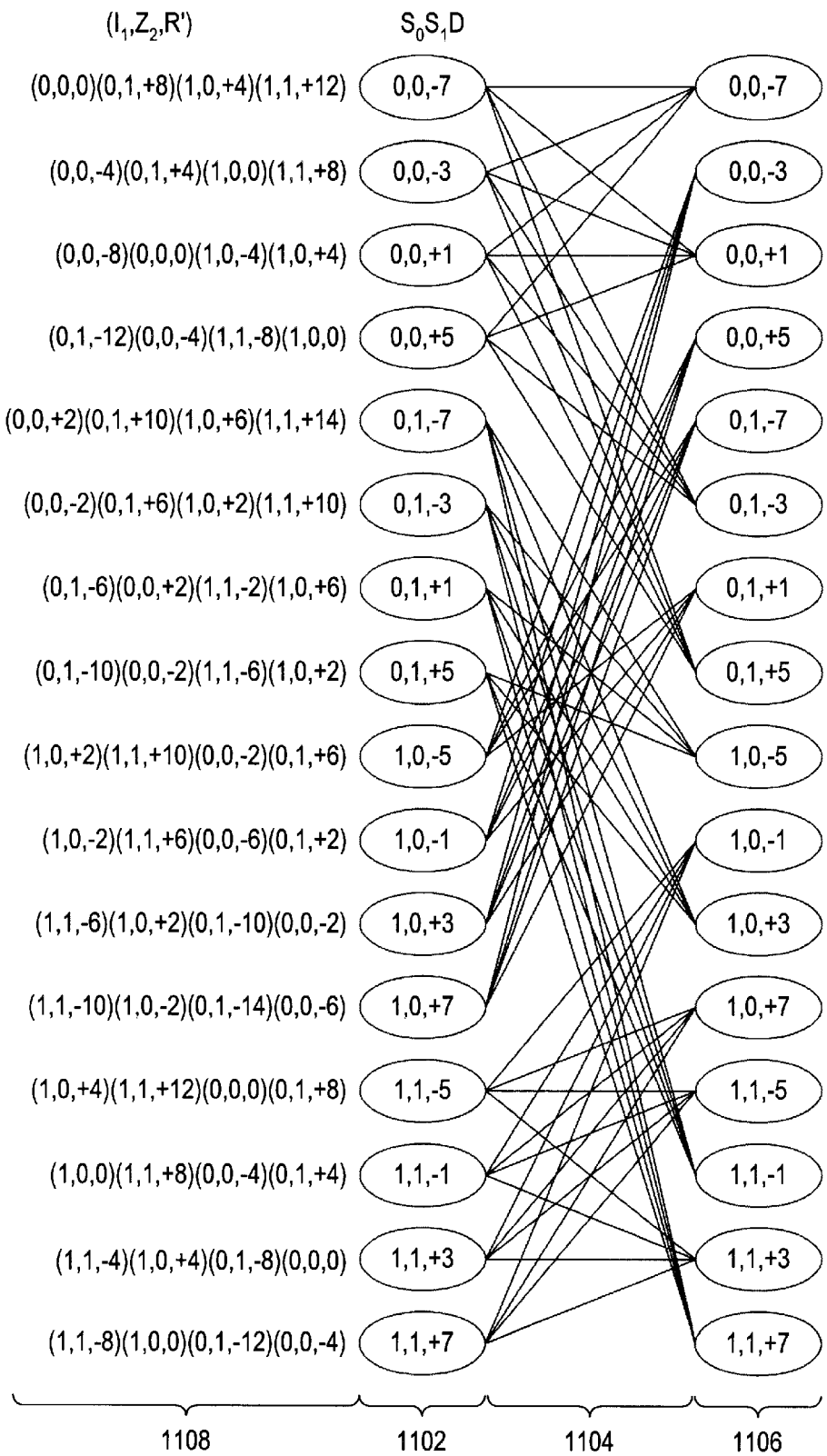
FIG. 11 shows one stage of a sixteen state trellis.

FIG. 11 illustrates a 16 state trellis which may be used to replace the 8 state trellis used by decoder 602. States 1102, 1106 are used to represent the binary contents of delay elements 306 ($S_0$) and 308 ($S_1$), and the eight-level contents of delay element 706 (D). Since the contents of D is not independent of the contents of $S_0$ and $S_1$, this results in 16 trellis states 1102 as listed in FIG. 11. From each state 1102, four transitions 1104 to subsequent states 1106 are possible, one for each two-bit input symbol encoded by encoder 202. The correspondence between input bits $I_0$, $I_1$, expected signal values R', and the transitions 1104 is specified by ordering of the ($I_0,I_1$,R') triplets 1108 from left to right to correspond from top to bottom with the transitions 1104 leaving any given state 1102. This 16 state trellis may be used to decode signals encoded by the feedback trellis encoder shown in FIG. 3.

Figure 4:
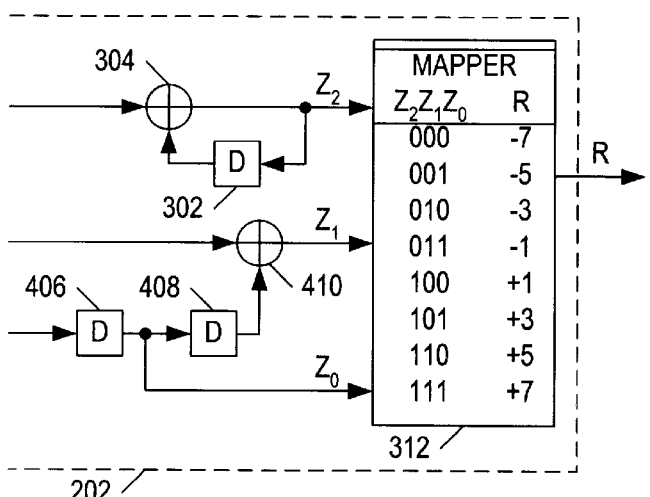
FIG. 4 is a block diagram of a moving-window trellis encoder.
Figure 5:
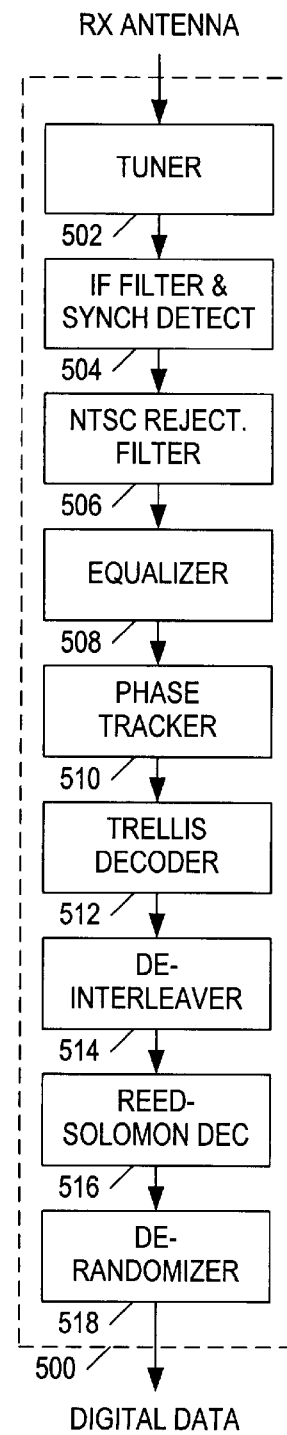
FIG. 5 is a functional block diagram of an ATV receiver.
Figure 6:
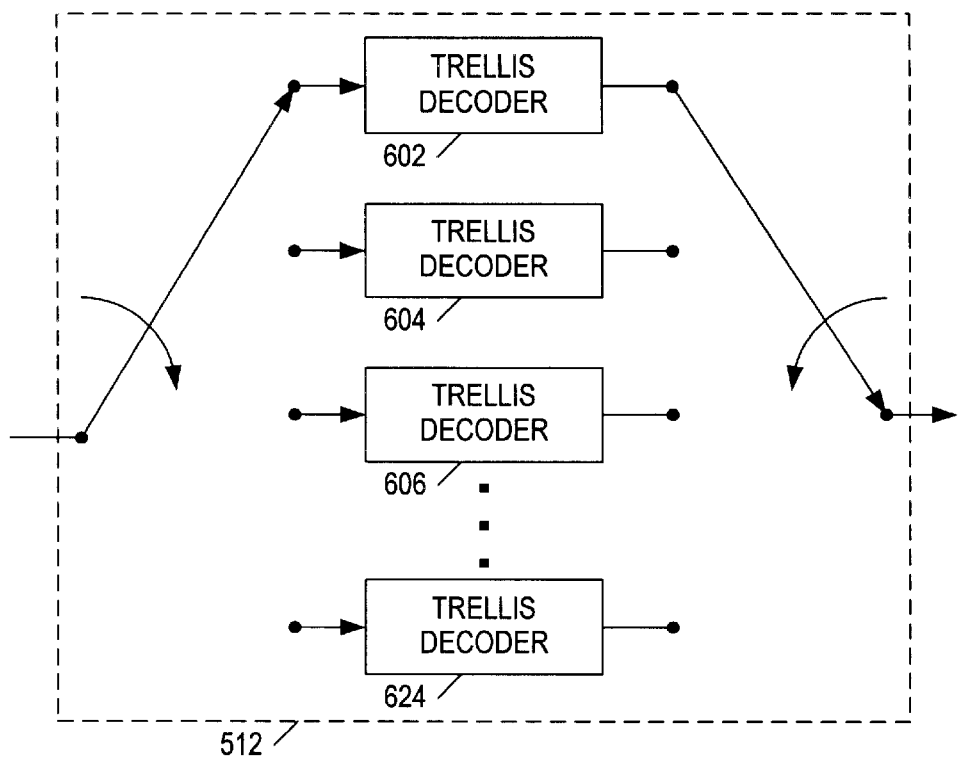
FIG. 6 is a functional block diagram of an interleaved trellis decoder.
Figure 7:
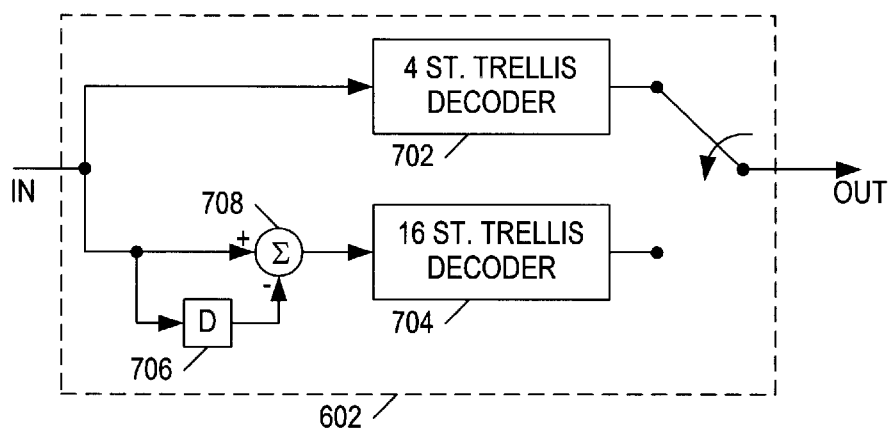
FIG. 7 illustrates modes of operation of a two-mode trellis decoder.
Figure 8:
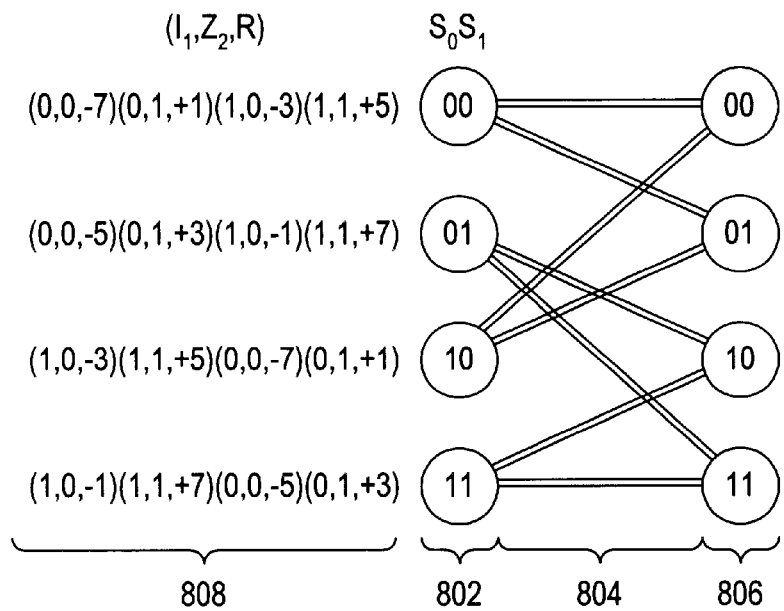
FIG. 8 shows one stage of a four state trellis.
Figure 9:
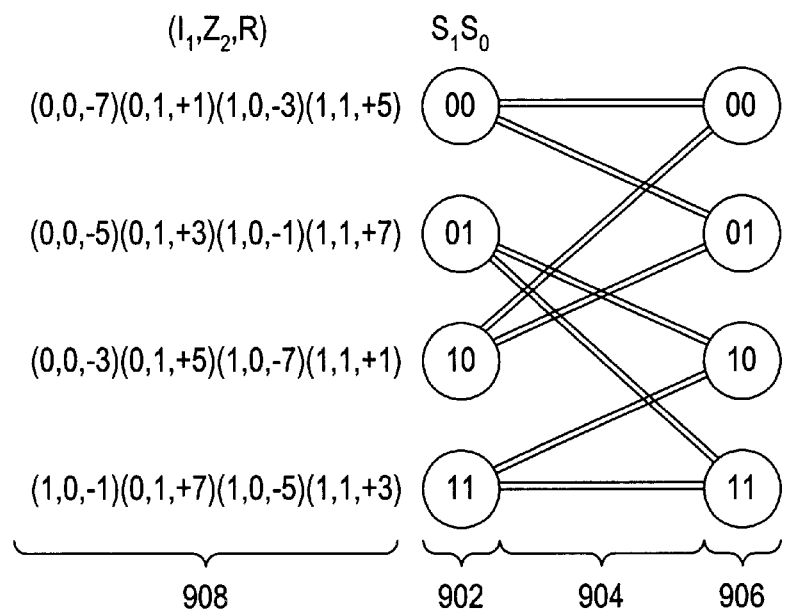
FIG. 9 shows one stage of a related four state trellis.
Figure 10:
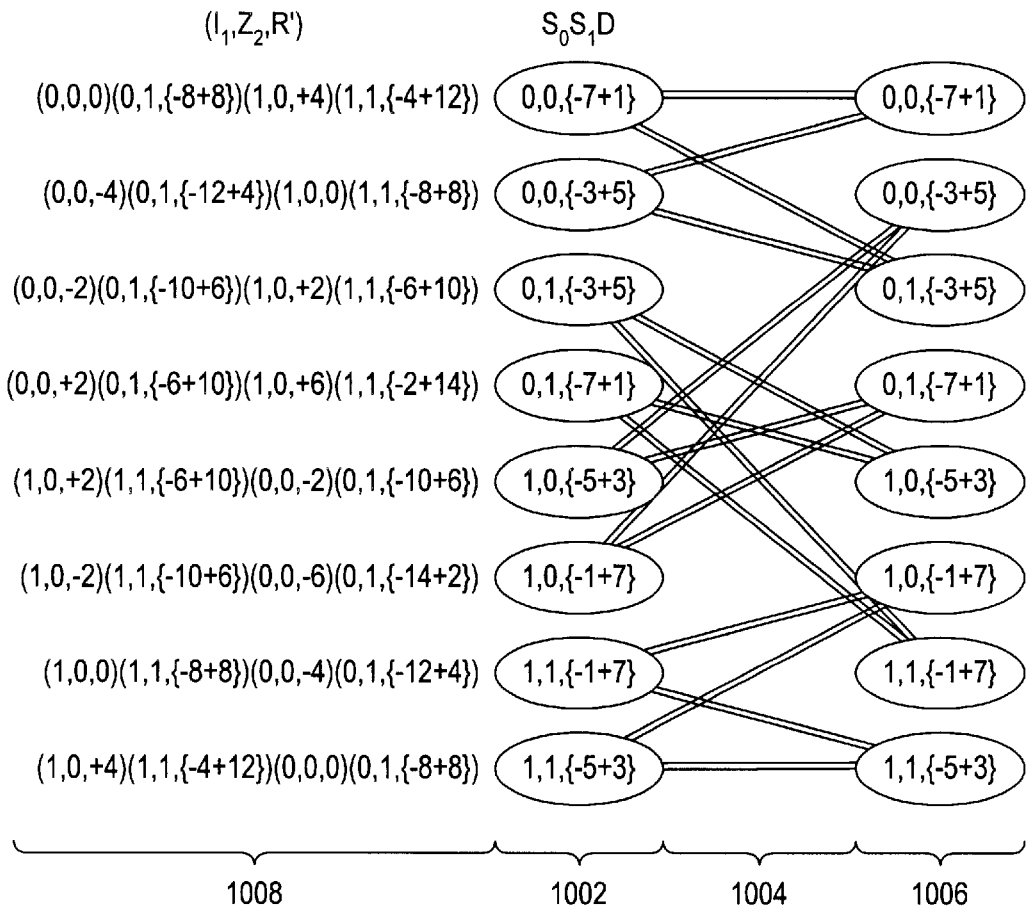
FIG. 10 shows one stage of an eight state trellis.
Figure 12:
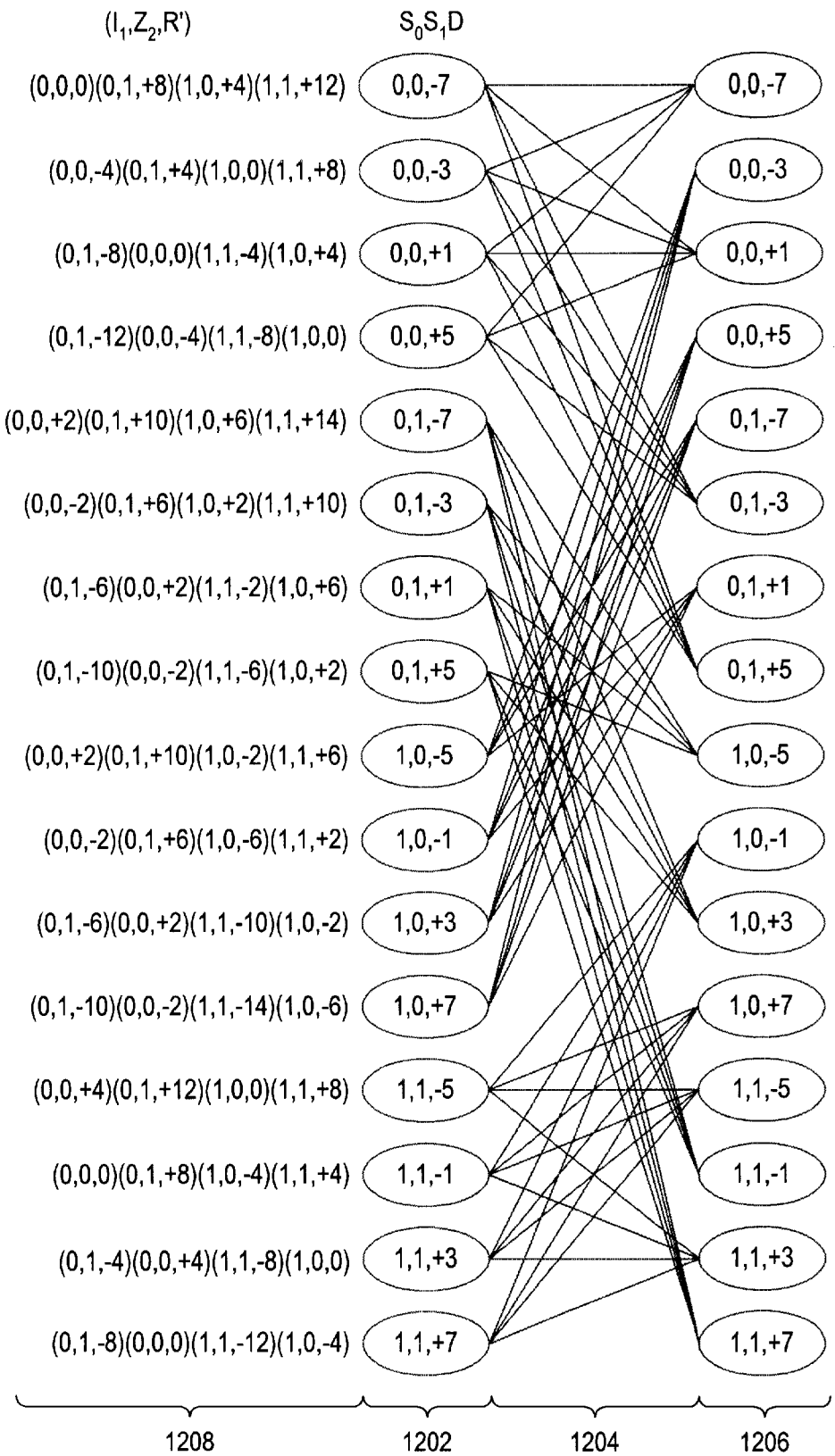
FIG. 12 shows one stage of a related sixteen state trellis.

As illustrated by FIG. 12, a similar 16 state trellis may be used to replace the 8 state trellis used by decoder 602 to decode signals encoded using the moving-window trellis encoder shown in FIG. 4. States 1202, 1206 represent the binary contents of delay elements 406 ($S_0$) and 408 ($S_1$) and the contents of delay element 706 (D). The correspondence between expected values R' for the transitions 1204 and the input bits $I_0$, $I_1$ is altered, so the input bits decoded for selected transitions changes. This is reflected in the new triplets 1208. It is noted that the correspondence between expected signal values R' and the transitions is unaltered relative to FIG. 11, so the distance properties (and hence the performance) of the trellis are unaltered.

Figure 13:
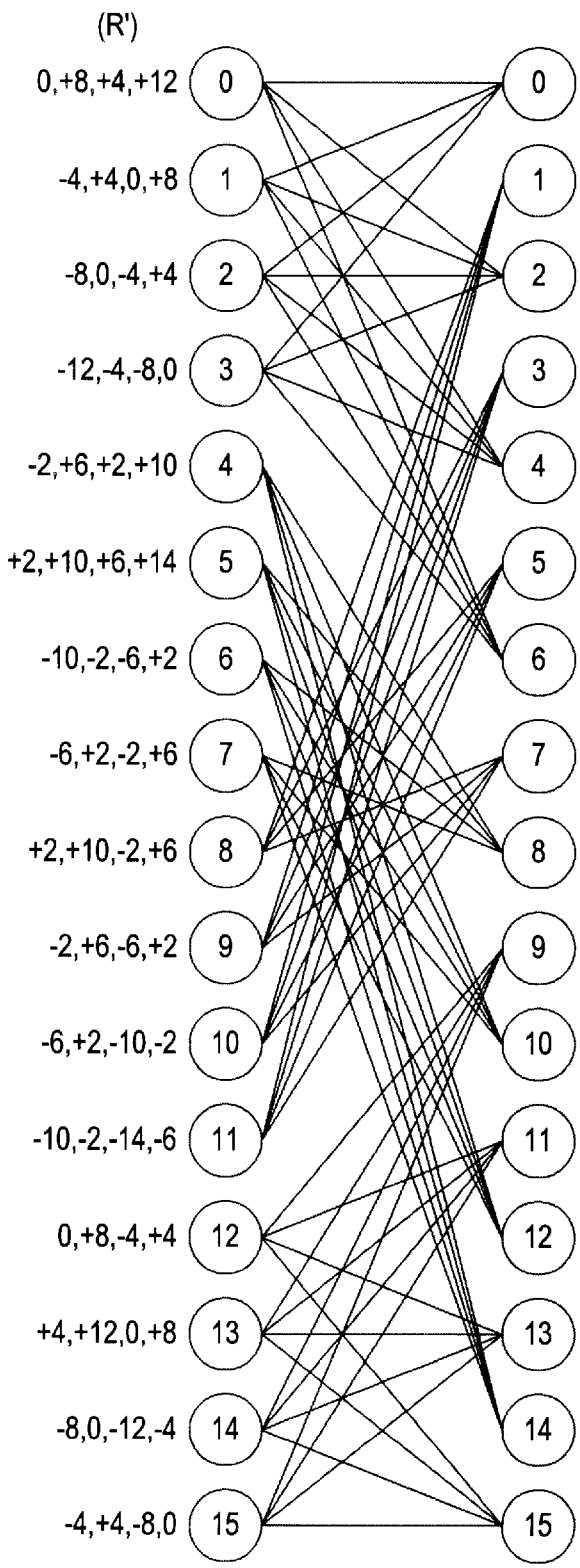
FIG. 13 shows one stage of a sixteen state trellis in generic form.

The trellises of FIGS. 11 and 12 may be represented in generic form as shown in FIG. 13. Here, only the expected signal values R' are given, and the correspondence between input bits and transitions is ignored since it has negligible impact on the code performance. This generic form is commonly used to describe and analyze a trellis code. It is noted that one trellis stage may be represented by four bipartite graphs, i.e. four groups of nodes and edges in which each group can be represented as two sets of nodes having each of the nodes in one set connected by an edge to all the nodes in the other set. These graphs are colloquially referred to as "butterflies". Each butterfly here has a set of four source states and four destination states The four butterflies are:

| source states | destination states |
|---|---|
| 0,1,2,3 | 0,2,4,6 |
| 4,5,6,7 | 8,10,12,14 |
| 8,9,10,11 | 1,3,5,7 |
| 12,13,14,15 | 9,11,13,15 |

Each of the source states within a bipartite graph is connected to all the destination states. The transitions between states have the following associated expected values:

| source states | | destination states | | |
|---|---|---|---|---|
| first graph | 0 | 2 | 4 | 6 |
| 0 | 0 | +8 | +4 | +12 |
| 1 | −4 | +4 | 0 | +8 |
| 2 | −8 | 0 | −4 | +4 |
| 3 | −12 | −4 | −8 | 0 |
| second graph | 8 | 10 | 12 | 14 |
| 4 | −2 | +6 | +2 | +10 |
| 5 | +2 | +10 | +6 | +14 |
| 6 | −10 | −2 | −6 | +2 |
| 7 | −6 | +2 | −2 | +6 |
| third graph | 1 | 3 | 5 | 7 |
| 8 | +2 | +10 | −2 | +6 |
| 9 | −2 | +6 | −6 | +2 |
| 10 | −6 | +2 | −10 | −2 |
| 11 | −10 | −2 | −14 | −6 |
| fourth graph | 9 | 11 | 13 | 15 |
| 12 | 0 | +8 | −4 | +4 |
| 13 | +4 | +12 | 0 | +8 |
| 14 | −8 | 0 | −12 | −4 |
| 15 | −4 | +4 | −8 | 0 |

It should be noted that that certain permutations of state labels can be performed without For example states 0,2 can be exchanged, as can 1,3; 4,6; 5,7; 8,10; 9,11; 12.14 and/or 13,15.

Figure 14:
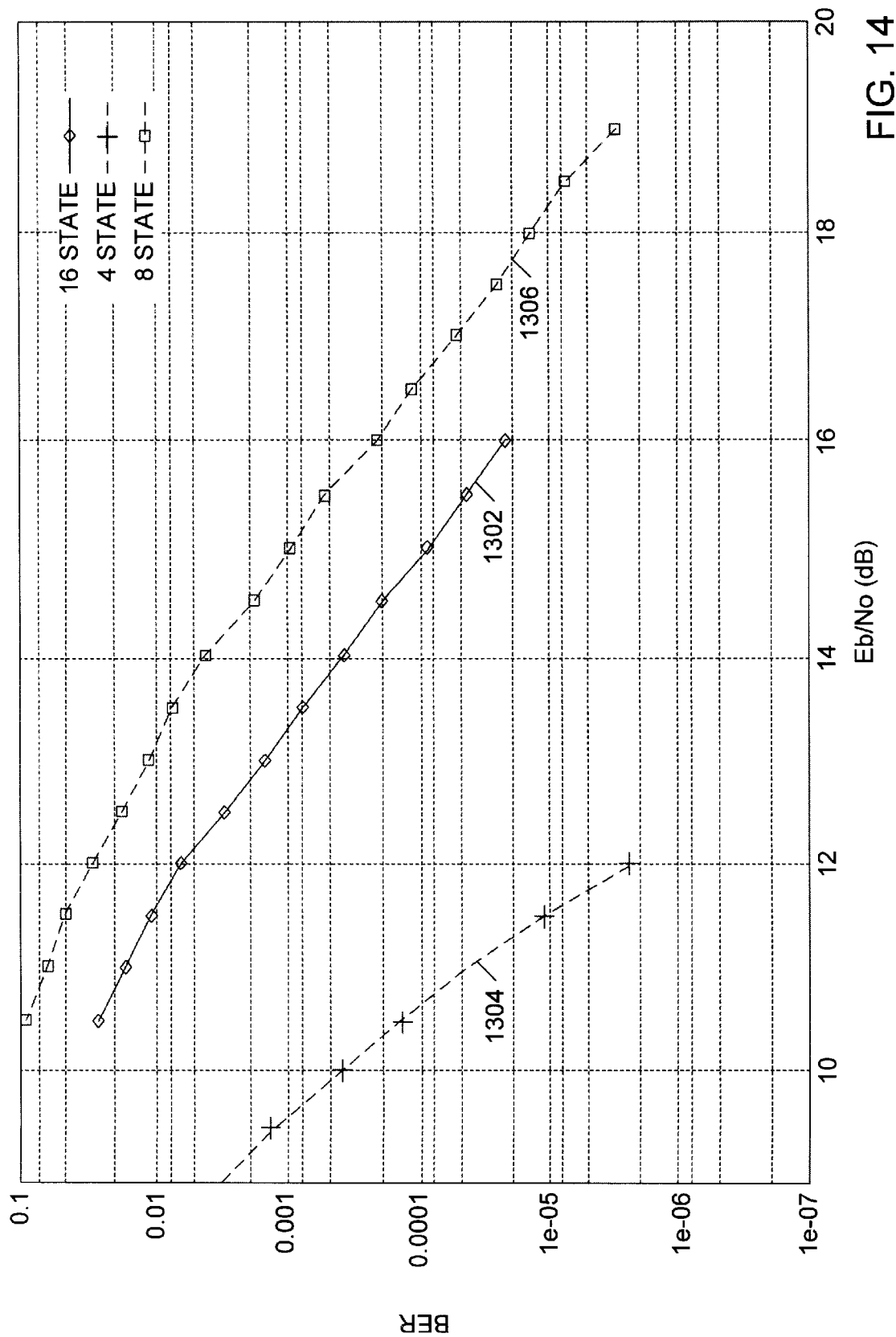
FIG. 14 is a graph of the performance improvement achieved according to simulations.

The minimum squared difference ($4^2+2^2+2^2+4^2=40$) between divergent paths through the trellis can be found between paths 0-4-8-1-0 and 0-0-0-0-0. Although this minimum divergent path of the of the 16 state trellises is the same as that of the 8 state trellises, the minimum divergent path length is altered and the number of most-likely sequences being tracked is doubled. FIG. 14 shows that improved performance is achieved by the 16-state filter in simulation. The graph axes in FIG. 14 are signal-to-noise ratio (horizontal axis) and bit error rate (vertical axis). At any given signal-to-noise ratio, curve 1302 is below curve 1306, indicating a reduced bit error rate for the 16 state trellis relative to the 8 state trellis. In fact, the gain in signal-to-noise ratio is approximately 1.5 dB, i.e. the 8 state trellis requires a signal-to-noise ratio 1.5 dB higher to achieve a bit error rate comparable to the 16 state trellis. These simulations were done assuming white noise in the channel (prior to the comb filter) and assuming no NTSC interference penetrates the comb filter.

For comparison, a curve 1304 is also shown for the 4 state trellis without the comb filter. It is noted that rather than the expected 3.3 dB degradation for the 8 state trellis with the comb filter (expected due to amplified noise and an increased number of valid decision symbols), the actual performance of the 8 state trellis is about 6 dB worse than the performance of the 4 state trellis. With the 16 state trellis, the loss is reduced to about 4.5 dB.

Numerous variations and modifications will become apparent to those skilled in the art once the above disclosure is fully appreciated. It is intended that the following claims be interpreted to embrace all such variations and modifications.

What is claimed is:

1. An ATV receiver with improved performance when subjected to NTSC co-channel interference, wherein the receiver comprises:
   a tuner configured to downmix a selected channel frequency signal to an intermediate frequency signal;
   a comb filter coupled to receive the intermediate frequency signal and configured to attenuate NTSC carrier frequencies from the intermediate frequency signal to produce a partial response signal;
   a trellis decoder coupled to receive the partial response signal and configured to demodulate the partial response signal to produce decoded symbols using a 16 state trellis, wherein each stage of the 16 state trellis comprises four transitions leaving each state corresponding to four bipartite graphs such that each bipartite graph includes four source states and four destination states, and wherein an encoder state $(S_0S_1)$ and partial response channel state (D) form the four bipartite graphs having the following sets of source states and destination states:

| bipartite graph | source states | destination states |
| --- | --- | --- |
| first | (0,0,−7), (0,0,−3), (0,0,+1), (0,0,+5) | (0,0,−7), (0,0,+1), (0,1,−3), (0,1,+5) |
| second | (0,1,−7), (0,1,−3), (0,1,+1), (0,1,+5) | (1,0,−5), (1,0,+3), (1,1,−1), (1,1,+7) |
| third | (1,0,−5), (1,0,−1), (1,0,+3), (1,0,+7) | (0,0,−3), (0,0,+5), (0,1,−7), (0,1,+1) |
| fourth | (1,1,−5), (1,1,−1), (1,1,+3), (1,1,+7) | (1,0,−1), (1,0,+7), (1,1,−5), (1,1,+3) |

2. The ATV receiver of claim 1, wherein the 16 state trellis includes a state for every possible combination of trellis encoder state $(S_0S_1)$ and partial response channel state (D).

3. The ATV receiver of claim 1, wherein in $(I_1I_2R')$ form the transitions in the bipartite graphs have the following expected signal values and decode bits $I_1I_2$:

| source states | | destination states | | |
| --- | --- | --- | --- | --- |
| first graph | (0,0,−7) | (0,0,+1) | (0,1,−3) | (0,1,+5) |
| (0,0,−7) | (0,0,0) | (0,1,+8) | (1,0,+4) | (1,1,+12) |
| (0,0,−3) | (0,0,−4) | (0,1,+4) | (1,0,0) | (1,1,+8) |
| (0,0,+1) | (0,1,−8) | (0,0,0) | (1,1,−4) | (1,0,+4) |
| (0,0,+5) | (0,1,−12) | (0,0,−4) | (1,1,−8) | (1,0,0) |
| second graph | (1,0,−5) | (1,0,+3) | (1,1,−1) | (1,1,+7) |
| (0,1,−7) | (0,0,+2) | (0,1,+10) | (1,0,+6) | (1,1,+14) |
| (0,1,−3) | (0,0,−2) | (0,1,+6) | (1,0,+2) | (1,1,+10) |
| (0,1,+1) | (0,1,−6) | (0,0,+2) | (1,1,−2) | (1,0,+6) |
| (0,1,+5) | (0,1,−10) | (0,0,−2) | (1,1,−6) | (1,0,+2) |
| third graph | (0,0,−3) | (0,0,+5) | (0,1,−7) | (0,1,+1) |
| (1,0,−5) | (1,0,+2) | (1,1,+10) | (0,0,−2) | (0,1,+6) |
| (1,0,−1) | (1,0,−2) | (1,1,+6) | (0,0,−6) | (0,1,+2) |
| (1,0,+3) | (1,1,−6) | (1,0,+2) | (0,1,−10) | (0,0,−2) |
| (1,0,+7) | (1,1,−10) | (1,0,−2) | (0,1,−14) | (0,0,−6) |
| fourth graph | (1,0,−1) | (1,0,+7) | (1,1,−5) | (1,1,+3) |
| (1,1,−5) | (1,0,+4) | (1,1,+12) | (0,0,0) | (0,1,+8) |
| (1,1,−1) | (1,0,0) | (1,1,+8) | (0,0,−4) | (0,1,+4) |
| (1,1,+3) | (1,1,−4) | (1,0,+4) | (0,1,−8) | (0,0,0) |
| (1,1,+7) | (1,1,−8) | (1,0,0) | (0,1,−12) | (0,0,−4) |

4. The ATV receiver of claim 1, wherein in $(I_1I_2R')$ form the transitions in the bipartite graphs have the following expected signal values R' and decode bits $I_1I_2$:

| source states | | destination states | | |
| --- | --- | --- | --- | --- |
| first graph | (0,0,−7) | (0,0,+1) | (0,1,−3) | (0,1,+5) |
| (0,0,−7) | (0,0,0) | (0,1,+8) | (1,0,+4) | (1,1,+12) |
| (0,0,−3) | (0,0,−4) | (0,1,+4) | (1,0,0) | (1,1,+8) |
| (0,0,+1) | (0,1,−8) | (0,0,0) | (1,1,−4) | (1,0,+4) |
| (0,0,+5) | (0,1,−12) | (0,0,−4) | (1,1,−8) | (1,0,0) |
| second graph | (1,0,−5) | (1,0,+3) | (1,1,−1) | (1,1,+7) |
| (0,1,−7) | (0,0,+2) | (0,1,+10) | (1,0,+6) | (1,1,+14) |
| (0,1,−3) | (0,0,−2) | (0,1,+6) | (1,0,+2) | (1,1,+10) |
| (0,1,+1) | (0,1,−6) | (0,0,+2) | (1,1,−2) | (1,0,+6) |
| (0,1,+5) | (0,1,−10) | (0,0,−2) | (1,1,−6) | (1,0,+2) |
| third graph | (0,0,−3) | (0,0,+5) | (0,1,−7) | (0,1,+1) |
| (1,0,−5) | (0,0,+2) | (0,1,+10) | (1,0,−2) | (1,1,+6) |
| (1,0,−1) | (0,0,−2) | (0,1,+6) | (1,0,−6) | (1,1,+2) |
| (1,0,+3) | (0,1,−6) | (0,0,+2) | (1,1,−10) | (1,0,−2) |
| (1,0,+7) | (0,1,−10) | (0,0,−2) | (1,1,−14) | (1,0,−6) |
| fourth graph | (1,0,−1) | (1,0,+7) | (1,1,−5) | (1,1,+3) |
| (1,1,−5) | (0,0,+4) | (0,1,+12) | (1,0,0) | (1,1,+8) |
| (1,1,−1) | (0,0,0) | (0,1,+8) | (1,0,−4) | (1,1,+4) |
| (1,1,+3) | (0,1,−4) | (0,0,+4) | (1,1,−8) | (1,0,0) |
| (1,1,+7) | (0,1,−8) | (0,0,0) | (1,1,−12) | (1,0,−4) |

5. A method for receiving an ATV transmission, wherein the method comprises:
   downmixing a selected channel signal to an intermediate frequency signal;
   filtering the intermediate frequency signal to screen out NTSC co-channel interference, wherein the filtering converts the intermediate frequency signal into a partial response signal;
   converting the partial response signal into detected digital symbols, wherein the converting includes:
   comparing a current partial response signal to an expected value for each transition in a trellis to determine a likelihood of a trellis path which includes that transition;
   comparing all likelihoods of paths which end in common destination states to determine a most likely path to each destination state;
   wherein the trellis includes 16 destination states, wherein each stage of the 16 state trellis comprises four transitions leaving each state corresponding to four bipartite graphs such that each bipartite graph includes four source states and four destination states, and wherein an encoder state ($S_0S_1$) and partial response channel state (D) form the four bipartite graphs having the following sets of source states and destination states:

| bipartite graph | source states | destination states |
|---|---|---|
| first | (0,0,−7), (0,0,−3), (0,0,+1), (0,0,+5) | (0,0,−7), (0,0,+1), (0,1,−3), (0,1,+5) |
| second | (0,1,−7), (0,1,−3), (0,1,+1), (0,1,+5) | (1,0,−5), (1,0,+3), (1,1,−1), (1,1,+7) |
| third | (1,0,−5), (1,0,−1), (1,0,+3), (1,0,+7) | (0,0,−3), (0,0,+5), (0,1,−7), (0,1,+1) |
| fourth | (1,1,−5), (1,1,−1), (1,1,+3), (1,1,+7) | (1,0,−1), (1,0,+7), (1,1,−5), (1,1,+3) |

6. The method of claim 5, wherein the 16-state trellis includes a destination state for every possible combination of encoder state and channel state.

7. The ATV receiver of claim 5, wherein in ($I_1I_2R'$) form the transitions in the bipartite graphs have the following expected values R' and digital symbol values $I_1I_2$:

| source states | | destination states | | |
|---|---|---|---|---|
| first graph | (0,0,−7) | (0,0,+1) | (0,1,−3) | (0,1,+5) |
| (0,0,−7) | (0,0,0) | (0,1,+8) | (1,0,+4) | (1,1,+12) |
| (0,0,−3) | (0,0,−4) | (0,1,+4) | (1,0,0) | (1,1,+8) |
| (0,0,+1) | (0,1,−8) | (0,0,0) | (1,1,−4) | (1,0,+4) |
| (0,0,+5) | (0,1,−12) | (0,0,−4) | (1,1,−8) | (1,0,0) |
| second graph | (1,0,−5) | (1,0,+3) | (1,1,−1) | (1,1,+7) |
| (0,1,−7) | (0,0,+2) | (0,1,+10) | (1,0,+6) | (1,1,+14) |
| (0,1,−3) | (0,0,−2) | (0,1,+6) | (1,0,+2) | (1,1,+10) |
| (0,1,+1) | (0,1,−6) | (0,0,+2) | (1,1,−2) | (1,0,+6) |
| (0,1,+5) | (0,1,−10) | (0,0,−2) | (1,1,−6) | (1,0,+2) |
| third graph | (0,0,−3) | (0,0,+5) | (0,1,−7) | (0,1,+1) |
| (1,0,−5) | (1,0,+2) | (1,1,+10) | (0,0,−2) | (1,1,+6) |
| (1,0,−1) | (1,0,−2) | (1,1,+6) | (0,0,−6) | (1,1,+2) |
| (1,0,+3) | (1,1,−6) | (1,0,+2) | (0,1,−10) | (0,0,−2) |
| (1,0,+7) | (1,1,−10) | (1,0,−2) | (0,1,−14) | (0,0,−6) |
| fourth graph | (1,0,−1) | (1,0,+7) | (1,1,−5) | (1,1,+3) |
| (1,1,−5) | (1,0,+4) | (1,1,+12) | (0,0,0) | (0,1,+8) |
| (1,1,−1) | (1,0,0) | (1,1,+8) | (0,0,−4) | (0,1,+4) |
| (1,1,+3) | (1,1,−4) | (1,0,+4) | (0,1,−8) | (0,0,0) |
| (1,1,+7) | (1,1,−8) | (1,0,0) | (0,1,−12) | (0,0,−4) |

8. The ATV receiver of claim 5, wherein in ($I_1I_2R'$) form the transitions in the bipartite graphs have the following expected values R and digital symbol values $I_1I_2$:

| source states | | destination states | | |
|---|---|---|---|---|
| first graph | (0,0,−7) | (0,0,+1) | (0,1,−3) | (0,1,+5) |
| (0,0,−7) | (0,0,0) | (0,1,+8) | (1,0,+4) | (1,1,+12) |
| (0,0,−3) | (0,0,−4) | (0,1,+4) | (1,0,0) | (1,1,+8) |
| (0,0,+1) | (0,1,−8) | (0,0,0) | (1,1,−4) | (1,0,+4) |
| (0,0,+5) | (0,1,−12) | (0,0,−4) | (1,1,−8) | (1,0,0) |
| second graph | (1,0,−5) | (1,0,+3) | (1,1,−1) | (1,1,+7) |
| (0,1,−7) | (0,0,+2) | (0,1,+10) | (1,0,+6) | (1,1,+14) |
| (0,1,−3) | (0,0,−2) | (0,1,+6) | (1,0,+2) | (1,1,+10) |
| (0,1,+1) | (0,1,−6) | (0,0,+2) | (1,1,−2) | (1,0,+6) |
| (0,1,+5) | (0,1,−10) | (0,0,−2) | (1,1,−6) | (1,0,+2) |
| third graph | (0,0,−3) | (0,0,+5) | (0,1,−7) | (0,1,+1) |
| (1,0,−5) | (0,0,+2) | (0,1,+10) | (1,0,−2) | (1,1,+6) |
| (1,0,−1) | (0,0,−2) | (0,1,+6) | (1,0,−6) | (1,1,+2) |
| (1,0,+3) | (0,1,−6) | (0,0,+2) | (1,1,−10) | (1,0,−2) |
| (1,0,+7) | (0,1,−10) | (0,0,−2) | (1,1,−14) | (1,0,−6) |
| fourth graph | (1,0,−1) | (1,0,+7) | (1,1,−5) | (1,1,+3) |
| (1,1,−5) | (0,0,+4) | (0,1,+12) | (1,0,0) | (1,1,+8) |
| (1,1,−1) | (0,0,0) | (0,1,+8) | (1,0,−4) | (1,1,+4) |
| (1,1,+3) | (0,1,−4) | (0,0,+4) | (1,1,−8) | (1,0,0) |
| (1,1,+7) | (0,1,−8) | (0,0,0) | (1,1,−12) | (1,0,−4) |

9. The method of claim 8, wherein the method further comprises transforming the detected digital symbols into digital audiovisual signals for presentation to an audience.

10. The method of claim 9, wherein the transforming includes:

de-interleaving the detected digital symbols to produce block encoded data packets;

decoding the encoded data packets to form error-corrected data packets; and de-randomizing the error-corrected data packets to produce source data packets.

11. A Viterbi decoder which is usable to demodulate ATV transmission signals which have been filtered to reduce NTSC interference, wherein the decoder operates according to a 16 state trellis comprised of four bipartite graphs each having four source states and four destination states as follows:

| bipartite graph | source states | destination states |
|---|---|---|
| first | 0,1,2,3 | 0,2,4,6 |
| second | 4,5,6,7 | 8,10,12,14 |
| third | 8,9,10,11 | 1,3,5,7 |
| fourth | 12,13,14,15 | 9,11,13,15 |

12. The Viterbi decoder of claim 11, wherein the bipartite graphs have expected values R' corresponding to transitions as follows:

| source states | destination states | | | |
|---|---|---|---|---|
| first graph | 0 | 2 | 4 | 6 |
| 0 | 0 | +8 | +4 | +12 |
| 1 | −4 | +4 | 0 | +8 |
| 2 | −8 | 0 | −4 | +4 |
| 3 | −12 | −4 | −8 | 0 |
| second graph | 8 | 10 | 12 | 14 |
| 4 | −2 | +6 | +2 | +10 |
| 5 | +2 | +10 | +6 | +14 |
| 6 | −10 | −2 | −6 | +2 |
| 7 | −6 | +2 | −2 | +6 |
| third graph | 1 | 3 | 5 | 7 |
| 8 | +2 | +10 | −2 | +6 |
| 9 | −2 | +6 | −6 | +2 |
| 10 | −6 | +2 | −10 | −2 |
| 11 | −10 | −2 | −14 | −6 |
| fourth graph | 9 | 11 | 13 | 15 |
| 12 | 0 | +8 | −4 | +4 |
| 13 | +4 | +12 | 0 | +8 |
| 14 | −8 | 0 | −12 | −4 |
| 15 | −4 | +4 | −8 | 0 |

13. The Viterbi decoder of claim 12, wherein the bipartite graphs have digital symbol values $I_1I_2$ corresponding to transitions as follows:

| source states | | destination states | | |
|---|---|---|---|---|
| first graph | 0 | 2 | 4 | 6 |
| 0 | 00 | 01 | 10 | 11 |
| 1 | 00 | 01 | 10 | 11 |
| 2 | 01 | 00 | 11 | 10 |
| 3 | 01 | 00 | 11 | 10 |
| second graph | 8 | 10 | 12 | 14 |
| 4 | 00 | 01 | 10 | 11 |
| 5 | 00 | 01 | 10 | 11 |
| 6 | 01 | 00 | 11 | 10 |
| 7 | 01 | 00 | 11 | 10 |
| third graph | 1 | 3 | 5 | 7 |
| 8 | 10 | 11 | 00 | 01 |
| 9 | 10 | 11 | 00 | 01 |
| 10 | 11 | 10 | 01 | 00 |
| 11 | 11 | 10 | 01 | 00 |
| fourth graph | 9 | 11 | 13 | 15 |
| 12 | 10 | 11 | 00 | 01 |
| 13 | 10 | 11 | 00 | 01 |
| 14 | 11 | 10 | 01 | 00 |
| 15 | 11 | 10 | 01 | 00 |

14. The Viterbi decoder of claim 12, wherein the bipartite graphs have digital symbol values $I_1I_2$ corresponding to transitions as follows:

| source states | | destination states | | |
|---|---|---|---|---|
| first graph | 0 | 2 | 4 | 6 |
| 0 | 00 | 01 | 10 | 11 |
| 1 | 00 | 01 | 10 | 11 |
| 2 | 01 | 00 | 11 | 10 |
| 3 | 01 | 00 | 11 | 10 |
| second graph | 8 | 10 | 12 | 14 |
| 4 | 00 | 01 | 10 | 11 |
| 5 | 00 | 01 | 10 | 11 |
| 6 | 01 | 00 | 11 | 10 |
| 7 | 01 | 00 | 11 | 10 |
| third graph | 1 | 3 | 5 | 7 |
| 8 | 00 | 01 | 10 | 11 |
| 9 | 00 | 01 | 10 | 11 |
| 10 | 01 | 00 | 11 | 10 |
| 11 | 01 | 00 | 11 | 10 |
| fourth graph | 9 | 11 | 13 | 15 |
| 12 | 00 | 01 | 10 | 11 |
| 13 | 00 | 01 | 10 | 11 |
| 14 | 01 | 00 | 11 | 10 |
| 15 | 01 | 00 | 11 | 10 |

\* \* \* \* \*